(12) United States Patent
Koga

(10) Patent No.: US 7,478,474 B2
(45) Date of Patent: Jan. 20, 2009

(54) METHOD OF MANUFACTURING SHIELDED ELECTRONIC CIRCUIT UNITS

(75) Inventor: Issei Koga, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 186 days.

(21) Appl. No.: 11/408,541

(22) Filed: Apr. 20, 2006

(65) Prior Publication Data
US 2006/0266547 A1    Nov. 30, 2006

(30) Foreign Application Priority Data
May 25, 2005 (JP) ............................. 2005-152561

(51) Int. Cl.
*H05K 3/30* (2006.01)
(52) U.S. Cl. .............................. 29/841; 29/412; 29/847; 29/852; 257/660; 257/699; 361/818; 438/113
(58) Field of Classification Search ................... 29/832, 29/835, 841, 846–849, 852, 853, 412, 415; 174/260; 257/659, 660, 678, 699, 787; 361/816, 361/818; 438/107, 113
See application file for complete search history.

(56) References Cited

U.S. PATENT DOCUMENTS 5,355,016 A * 10/1994 Swirbel et al. .............. 257/659
6,694,610 B1 * 2/2004 Kitade ........................ 29/832
7,180,012 B2 * 2/2007 Tsuneoka et al. ........... 174/260
7,187,060 B2 * 3/2007 Usui ........................... 257/660

FOREIGN PATENT DOCUMENTS

JP          2001-244688      9/2001

* cited by examiner

*Primary Examiner*—Donghai D. Nguyen
(74) *Attorney, Agent, or Firm*—Beyer Law Group LLP

(57) ABSTRACT

A metallic film and a grounding pattern are surely connected to each other so as to achieve electrical shield of an electronic circuit unit. In an electronic circuit unit, the metallic film is provided on a top surface of a sealing resin portion for burying an electronic component, the side surfaces of the sealing resin portion that are opposite to each other, and the side surfaces of the multi-layered substrate that are opposite to each other. The metallic film is connected to the grounding patterns that are provided on the top surface of the multi-layered substrate or between the laminated layers of the multi-layered substrate. Therefore, it is possible to achieve a superior electrical shielding effect through the metallic film, as compared with the related art. Since the metallic film is formed on the side surfaces of the sealing resin and the side surfaces of the multi-layered substrate, when the metallic film is formed by a plating method, the blind hole may not be provided in the related art. Therefore, it is possible to achieve the superior circulation of the plating liquid, which results in sure connection between the sure connection between the grounding pattern and the metallic film.

5 Claims, 12 Drawing Sheets

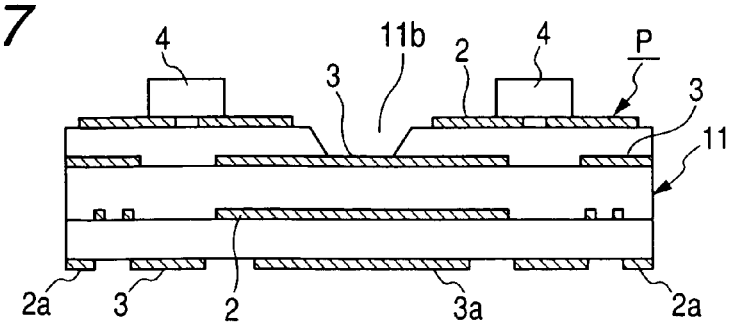
FIG. 17
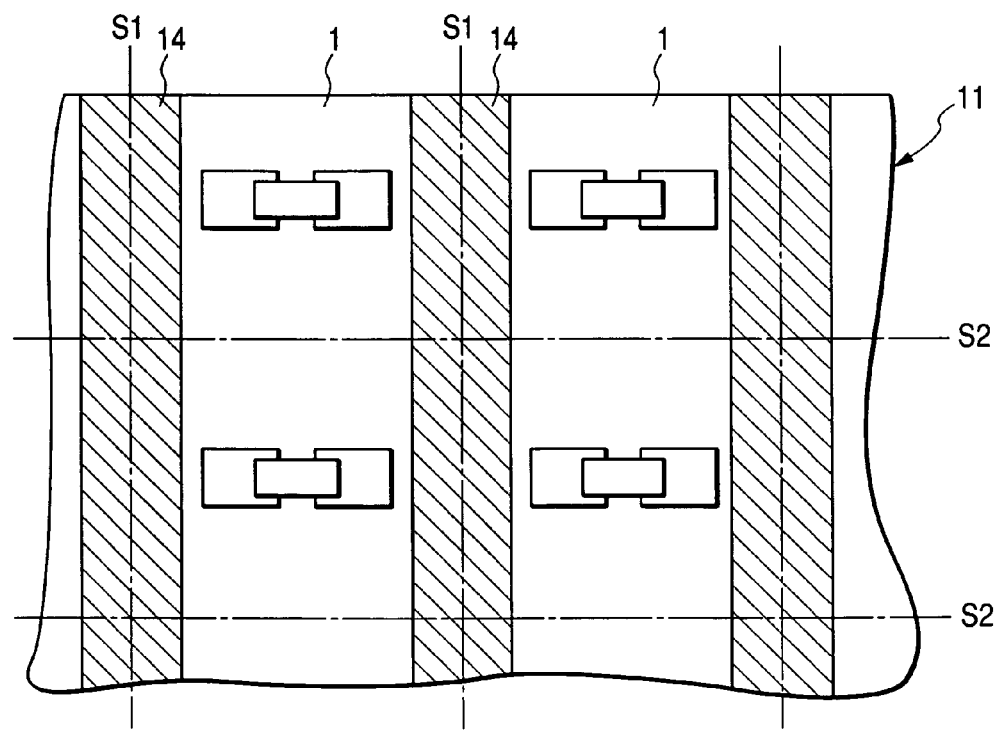
FIG. 18
FIG. 19
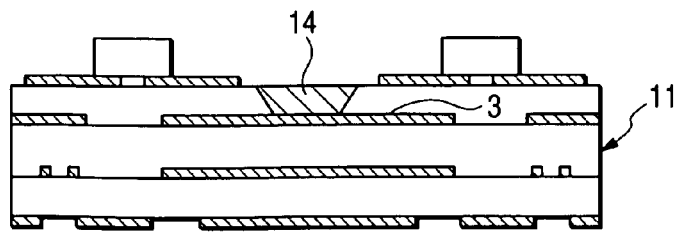

METHOD OF MANUFACTURING SHIELDED ELECTRONIC CIRCUIT UNITS

BACKGROUND OF THE INVENTION

1. Field of the Invention

The present invention relates to a shielded electronic circuit unit that is suitable for a voltage controller or the like and a method of manufacturing the same.

2. Description of the Related Art

FIG. 36 is a cross-sectional view illustrating a main portion of an electronic circuit unit according to the related art, and FIG. 37 is a cross-sectional view of a main portion illustrating a method of manufacturing the electronic circuit unit according to the related art. Next, a structure of the electronic circuit unit according to the related art will be described with reference to FIG. 36. In a multi-layered substrate 51, a wiring pattern P1, which has signal patterns 52 and grounding patterns 53, is provided. The signal patterns 52 of the wiring pattern P1 are provided on a top surface and laminated layers (inner laminated layers) of the multi-layered substrate 51, and have terminal portions 52a that are provided on lower portions of the side surfaces of the multi-layered substrate 51. In addition, the grounding patterns 53 are provided on the top surface and the bottom surface of the multi-layered substrate 51.

Each of electronic components 54, which are made of chip components, has first and second electrodes 54a and 54b provided on both ends. The electronic component 54 is disposed on a top surface of the multi-layered substrate 51. In the electronic component 54, the first electrode 54a is soldered to the signal pattern 52, and the second electrode 54b is soldered to the grounding pattern 53. Therefore, the electronic component 54 is mounted on the top surface of the multi-layered substrate 51.

A sealing resin portion 55 is made of an insulating material. In a state in which the sealing resin portion 55 buries the electronic components 54, it is provided on the top surface of the multi-layered substrate 51. In the sealing resin portion 55, a blind hole 55a is provided so as to extend from the top surface of the sealing resin portion 55 to the second electrode 54b for grounding.

In addition, a metallic film 56, which performs an electrical shield function, is provided on the top surface of the sealing resin portion 55, the wall surface of the blind hole 55a, and the second electrode 54b located at the bottom portion of the blind hole 55a. In this way, the electronic circuit unit according to the related art is formed.

In the electronic circuit unit according to the related art having the above-mentioned structure, although not shown, the bottom surface of the multi-layered substrate 51 is disposed on a mother substrate. In addition, the terminal portions 52a, which are provided on the side surface of the multi-layered substrate 51, are soldered to a conductive pattern provided on the mother substrate. As a result, the electronic circuit unit according to the related art is surface-mounted on the mother substrate.

However, the electronic circuit unit according to the related art has a structure in which the metallic film 56 performing an electrical shield function is provided on the only the top surface of the sealing resin portion 55. As a result, an electrical shield effect through the metallic film 56 is insufficient. In addition, since the metallic film 56 is provided in the blind hole 55a, in particular, when the metallic film 56 is formed by means of a plating method, the circulation of a plating liquid is insufficient in the blind hole 55a. As a result, the metallic film 56 is unstably attached to the second electrode 54b.

Then, a method of manufacturing the electronic circuit unit according to the related art will be described with reference to FIG. 37. First, an assembly substrate 57 is prepared so as to form the plurality of multi-layered substrates 51, and electronic components 54 are mounted so as to correspond to a plurality of multi-layered substrates 51 in the assembly substrate 57.

Then, the electronic components 54 are buried in the top surface of the assembly substrate 57, and the sealing resin portion 55 having the blind hole 55a provided at a location of the second electrode 54b are provided. Then, a metallic film 56 is provided which is formed on the top surface of the sealing resin portion 55 and in the blind hole 55a, and connected to the second electrode 54b. Then, at the location between the adjacent multi-layered substrates 51, the assembly substrate 57 and the sealing resin portion 55 are cut at a location of a cutting line S3 such that electronic circuit units are individually separated from each other. In this way, the electronic circuit unit according to the related art is completely manufactured.

However, in the method of manufacturing the electronic circuit unit according to the related art, the metallic film 56 for performing the electrical shield function is provided on only the top surface of the sealing resin portion 55. As a result, the electrical shield effect through the metallic film 56 is insufficient. In addition, since the metallic film 56 is provided in the blind hole 55a, in particular, when the metallic film 56 is formed by means of a plating method, the circulation of a plating liquid is insufficient in the blind hole 55a. As a result, the metallic film 56 is unstably attached to the second electrode 54b.

According to the electronic circuit unit and the method of manufacturing the same according to the related art, the electronic circuit unit according to the related art has a structure in which the metallic film 56 for performing an electrical shield function is provided on the only the top surface of the sealing resin portion 55. As a result, the electrical shield effect through the metallic film 56 is insufficient. In addition, since the metallic film 56 is provided in the blind hole 55a, in particular, when the metallic film 56 is formed by means of a plating method, the circulation of a plating liquid is insufficient in the blind hole 55a. As a result, the metallic film 56 is unstably attached to the second electrode 54b.

SUMMARY OF THE INVENTION

The present invention has been finalized in view of the drawbacks inherent in the electronic circuit unit according to the related art, and it is an object of the present invention to provide an electronic circuit unit which is capable of achieving a super electrical shielding effect and sure connection between a metallic film and a grounding pattern, and a method of manufacturing the same.

According to a first aspect of the invention, there is provided a shielded electronic circuit unit. The shielded electronic circuit unit includes: a multi-layered substrate on which a wiring pattern is provided; an electronic component that is mounted on a top surface of the multi-layered substrate; and a sealing resin portion that is made of an insulating material, the sealing resin portion being disposed on the top surface of the multi-layered substrate in a state in which the sealing resin portion buries the electronic component. The multi-layered substrate has two pairs of side surfaces that are opposite to each other, the wiring pattern has grounding patterns that are provided on the top surface of the multi-layered substrate or/and between laminated layers, the sealing resin portion has a top surface, and two pairs of side surfaces that are opposite to each other, a metallic film is provided on the top surface of the sealing resin portion, and the side surfaces of the sealing resin portion that are opposite to each other, and the metallic film is provided on the side surfaces of the multi-layered substrate that are opposite to each other, and connected to the connection patterns at the locations of the side surfaces.

Preferably, the metallic film is provided on an entire surface of the top surface of the sealing resin portion and entire surfaces of the side surfaces of the sealing resin portion that are opposite to each other, the metallic film is connected to the grounding patterns that are provided between the laminated layers of the multi-layered substrate; and the metallic film is provided on the entire surfaces of the side surfaces that are located between the top surface of the multi-layered substrate and the grounding patterns and are opposite to each other.

Preferably, the wiring pattern has the grounding pattern and signal patterns, and the signal patterns are provided between the laminated layers of the multi-layered substrate that are located above the grounding patterns.

Preferably, the multi-layered substrate has connection conductors, the connection conductors being provided over regions between the top surface of the multi-layered substrate and portions of the side surfaces of the multi-layered substrate where the grounding patterns are located, the connection conductors being connected to the grounding patterns at the locations of the side surfaces of the multi-layered substrate, and the connection conductors are connected to the metallic film.

Preferably, the multi-layered substrate has side electrodes. The side electrodes are provided on concave side surfaces reaching from the top surface of the multi-layered substrate to the bottom surface of the multi-layered substrate. The side electrodes are connected to the grounding patterns at the locations of the concave side surfaces. The side electrodes are connected to the metallic film.

Preferably, on a bottom surface of the multi-layered substrate, terminal portions that are connected to the electronic component, and the grounding pattern are provided.

According to a second aspect, there is provided a method of manufacturing the above-mentioned shielded electronic circuit unit. The method includes: forming the electronic components and the sealing resin portion in the assembly substrate, the electronic components being mounted so as to correspond to the individual multi-layered substrates, the sealing resin portion burying the electronic components; forming slit portions in the assembly substrate and the sealing resin portion at locations between the multi-layered substrates that are adjacent to each other, the slit portions being provided so as to extend from the top surface of the sealing resin portion to a location to which the grounding patterns located between the laminated layers are exposed, in a state in which the plurality of multi-layered substrates are connected to each other by means of a connecting portion located on a lower portion side of the assembly substrate; forming the side surfaces opposite to each other in the sealing resin portion by means of the slit; forming portions of the side surfaces opposite to each other in the multi-layered substrate by means of the slit portion; forming the metallic film in the sealing resin portion and the assembly substrate including the inner portion of the slit portion, the metallic film being connected to the grounding patterns located between the laminated layers; forming cutting portions in the assembly substrate or the assembly substrate and the sealing resin portion at locations between the adjacent multi-layer substrates; and individually separating the electronic circuit units from each other.

According to a third aspect of the invention, there is provided a method of manufacturing the above-mentioned shielded electronic circuit unit. The method includes: forming the electronic components, cutting grooves, conductor portions, and the sealing resin portion in the assembly substrate, the electronic components being mounted so as to correspond to the individual multi-layered substrates, the cutting grooves exposing the grounding patterns that are provided between the adjacent multi-layered substrates and located between the laminated layers, the conductor portions forming connection conductors that are connected to the grounding patterns and filled into the cutting grooves, the sealing resin portion burying the electronic components and the top surfaces of the conductor portions; forming slit portions in the assembly substrate and the sealing resin portion at locations between the multi-layered substrates that are adjacent to each other, the slit portions being provided to extend from the top surface of the sealing resin portion to locations to which the grounding patterns located between the laminated layers are exposed, in a state in which the plurality of multi-layered substrates are connected to each other by means of a connecting portion located on a lower portion side of the assembly substrate; forming the side surfaces opposite to each other in the sealing resin portion by means of the slit portion; forming portions of the side surfaces opposite to each other in the multi-layered substrate by means of the slit portion; dividing the conductor portions by the slit portions; forming the connection conductors connected to the grounding patterns in the slit portions; forming the metallic film in the sealing resin portion and the assembly substrate including the inner portion of the slit portion, the metallic film being connected to the connection conductors and the grounding patterns located between the laminated layers; forming cutting portions in the assembly substrate or the assembly substrate and the sealing resin portion at locations between the adjacent multi-layer substrates; and individually separating the electronic circuit units from each other.

According to a fourth aspect of the invention, there is provided a method of manufacturing the above-mentioned shielded electronic circuit unit. The method includes: forming the electronic components, through holes, conductors, and the sealing resin portion in the assembly substrate, the electronic components being mounted so as to correspond to the individual multi-layered substrates, the through holes exposing the grounding patterns that are provided between the adjacent multi-layered substrates and located between the laminated layers so as to form the concave side surfaces, the conductors forming connection conductors that are connected to the grounding patterns and form the side electrodes that are formed on the wall surfaces of the through holes, the sealing resin portion burying the electronic components and the top surfaces of the through holes; forming slit portions in the assembly substrate and the sealing resin portion at locations between the multi-layered substrates that are adjacent to each other, the slit portions being provided to extend from the top surface of the sealing resin portion to locations to which the grounding patterns located between the laminated layers are exposed, in a state in which the plurality of multi-layered substrates are connected to each other by means of a connecting portion located on a lower portion side of the assembly substrate; forming the side surfaces opposite to each other in the sealing resin portion by means of the slit portion; forming portions of the side surfaces opposite to each other in the multi-layered substrate by means of the slit portion; dividing portions of the through holes and the conductors by the slit portions; forming portions of the side electrodes that are connected to the grounding patterns in the concave side surfaces located in the divided through holes; forming the metallic film that is connected to the portions of the side electrodes and the grounding patterns located between the laminated layers in the sealing resin portion and the assembly substrate including the concave side surfaces and the inner surfaces of the slit portions; forming cutting portions in the assembly substrate or the assembly substrate and the sealing resin portion at locations between the adjacent multi-layer substrates; and individually separating the electronic circuit units from each other.

Preferably, the cutting portion has a smaller width than the slit portion.

Preferably, the slit portions are formed in a lattice in a state in which the slit portions are located between the adjacent multi-layered substrates, and the cutting portion is provided on the connection portion provided so as to correspond to the location of the slit portion, such that electronic circuit units are individually separated from each other.

Preferably, the metallic film is formed by a plating method.

BRIEF DESCRIPTION OF THE DRAWINGS

FIG. 17 is a cross-sectional view illustrating a first process of a method of manufacturing an electronic circuit unit according to a third embodiment of the invention;

FIG. 18 is a plan view illustrating a second process of a method of manufacturing an electronic circuit unit according to a third embodiment of the invention;

FIG. 19 is a cross-sectional view illustrating a second process of a method of manufacturing an electronic circuit unit according to a third embodiment of the invention;

DESCRIPTION OF THE PREFERRED EMBODIMENT

Figure 1:
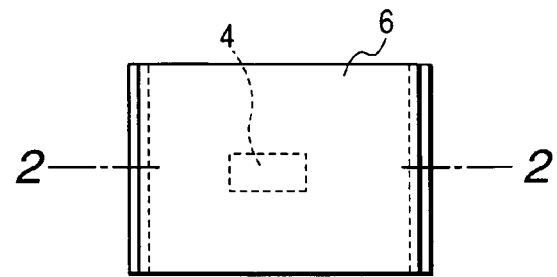
FIG. 1 is a plan view illustrating an electronic circuit unit according to a first embodiment of the invention.
Figure 2:
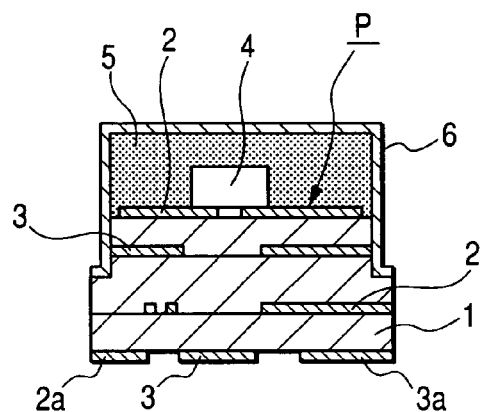
FIG. 2 is a cross-sectional view taken along the line II-II of FIG. 1.
Figure 3:
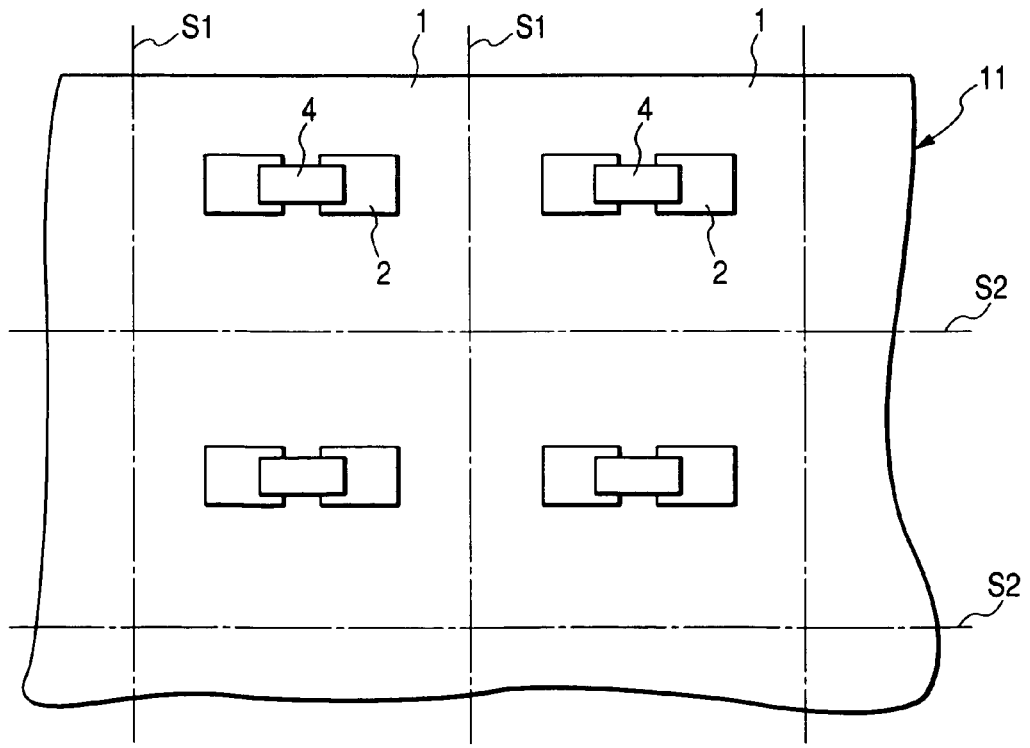
FIG. 3 is a plan view illustrating one process of a method of manufacturing the electronic circuit unit according to the first embodiment of the invention.
Figure 4:
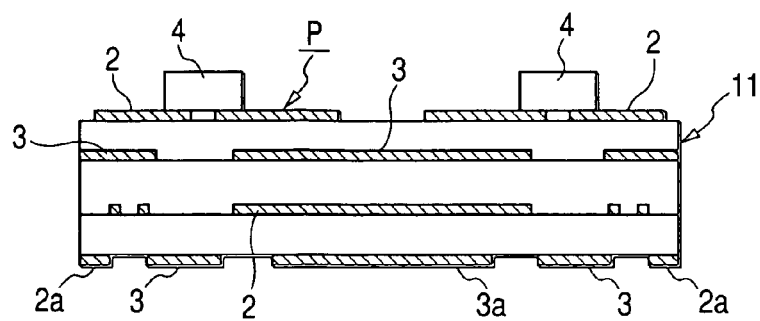
FIG. 4 is a cross-sectional view illustrating one process of a method of manufacturing the electronic circuit unit according to the first embodiment of the invention.
Figure 5:
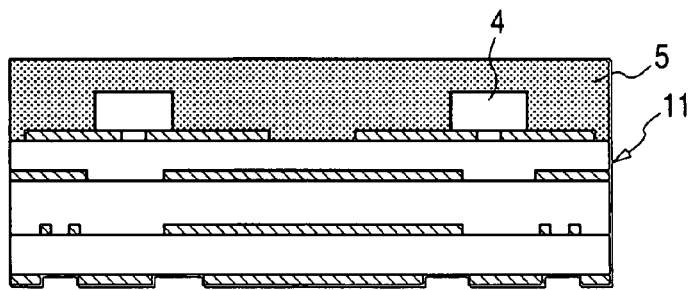
FIG. 5 is a cross-sectional view illustrating a second process of a method of manufacturing the electronic circuit unit according to the first embodiment of the invention.
Figure 6:
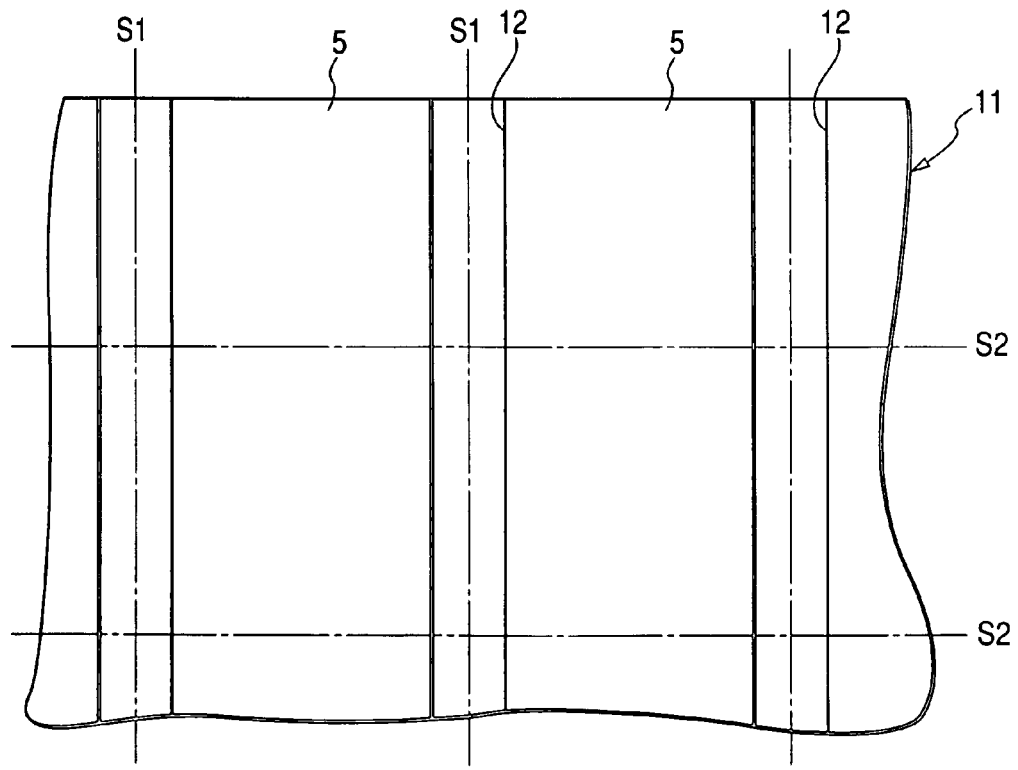
FIG. 6 is a plan view illustrating a third process of a method of manufacturing the electronic circuit unit according to the first embodiment of the invention.
Figure 7:
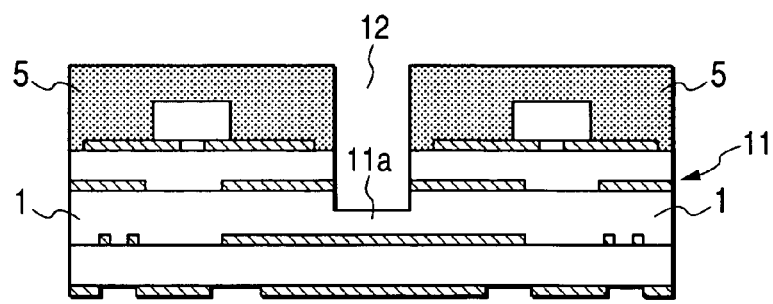
FIG. 7 is a cross-sectional view illustrating a third process of a method of manufacturing the electronic circuit unit according to the first embodiment of the invention.
Figure 8:
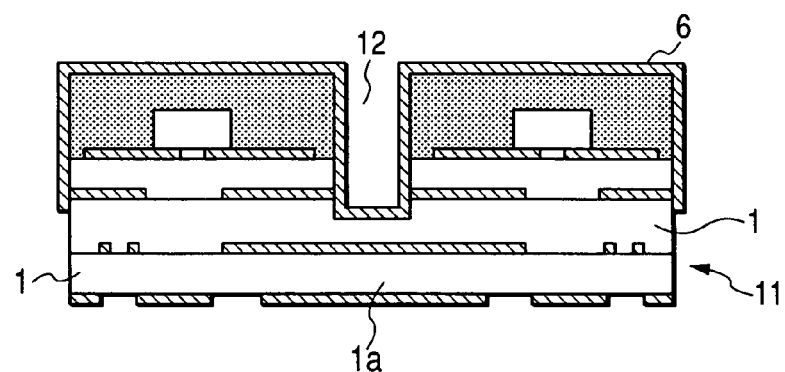
FIG. 8 is a cross-sectional view illustrating a fourth process of a method of manufacturing the electronic circuit unit according to the first embodiment of the invention.
Figure 9:
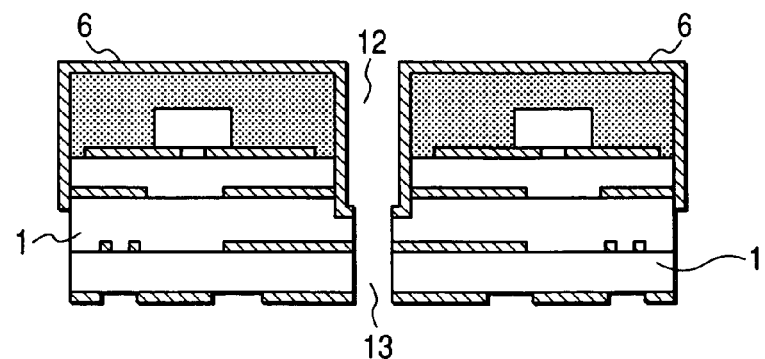
FIG. 9 is a cross-sectional view illustrating a fifth process of a method of manufacturing the electronic circuit unit according to the first embodiment of the invention.

FIG. 1 is a plan view illustrating an electronic circuit unit according to a first embodiment of the invention. FIG. 2 is a cross-sectional view taken along the line II-II of FIG. 1. FIG. 3 is a plan view illustrating one process of a method of manufacturing the electronic circuit unit according to the first embodiment of the invention. FIG. 4 is a cross-sectional view illustrating one process of a method of manufacturing the electronic circuit unit according to the first embodiment of the invention. FIG. 5 is a cross-sectional view illustrating a second process of a method of manufacturing the electronic circuit unit according to the first embodiment of the invention. FIG. 6 is a plan view illustrating a third process of a method of manufacturing the electronic circuit unit according to the first embodiment of the invention. FIG. 7 is a cross-sectional view illustrating a third process of a method of manufacturing the electronic circuit unit according to the first embodiment of the invention. FIG. 8 is a cross-sectional view illustrating a fourth process of a method of manufacturing the electronic circuit unit according to the first embodiment of the invention. FIG. 9 is a cross-sectional view illustrating a fifth process of a method of manufacturing the electronic circuit unit according to the first embodiment of the invention.

Figure 10:
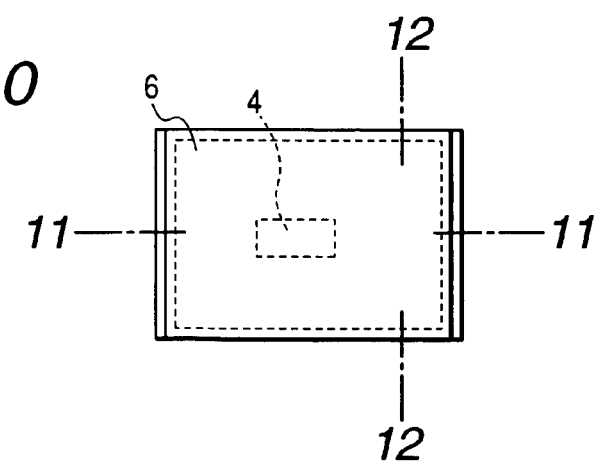
FIG. 10 is a plan view illustrating an electronic circuit unit according to a second embodiment of the invention.
Figure 11:
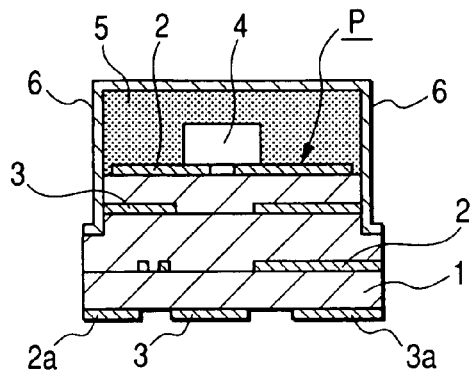
FIG. 11 is a cross-sectional view taken along the line XI-XI of FIG. 10.
Figure 12:
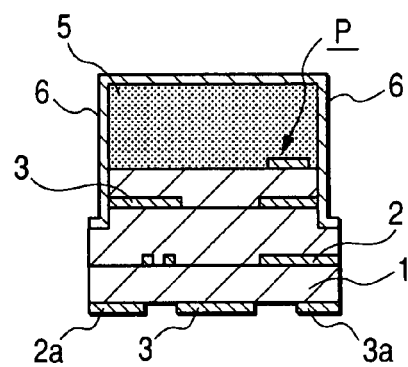
FIG. 12 is a cross-sectional view taken along the line XII-XII of FIG. 10.
Figure 13:
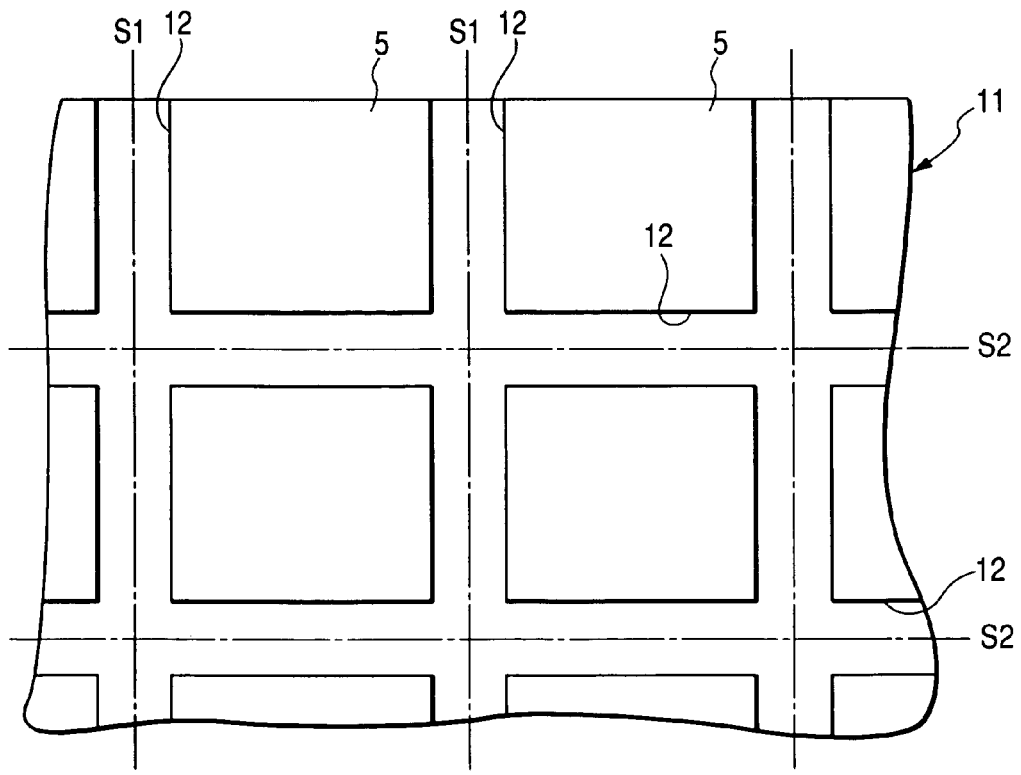
FIG. 13 is a plan view illustrating a third process of a method of manufacturing the electronic circuit unit according to the second embodiment of the invention.
Figure 14:
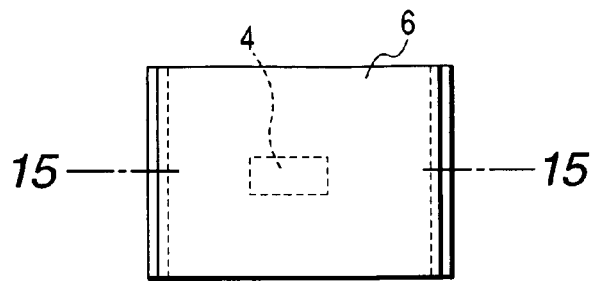
FIG. 14 is a plan view illustrating an electronic circuit unit according to a third embodiment of the invention.
Figure 15:
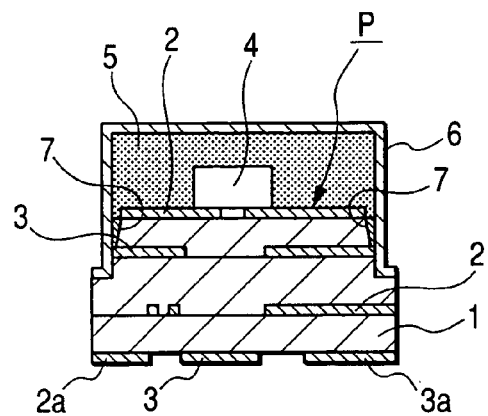
FIG. 15 is a cross-sectional view taken along the line XV-XV of FIG. 14.
Figure 16:
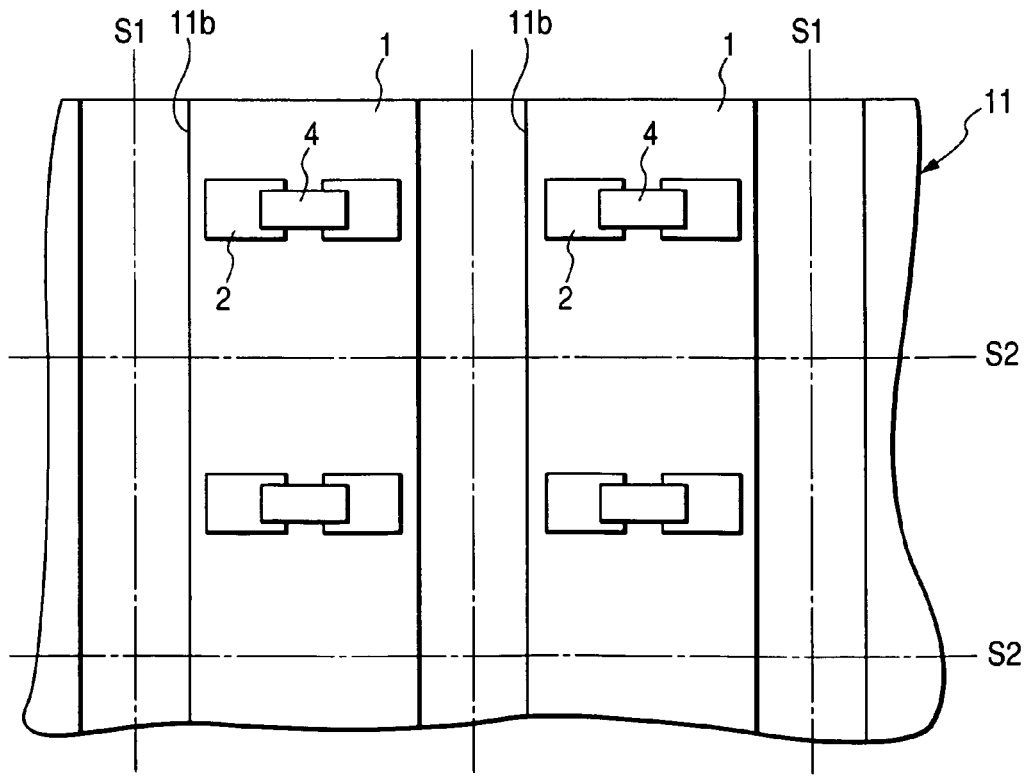
FIG. 16 is a plan view illustrating a first process of a method of manufacturing an electronic circuit unit according to a third embodiment of the invention.
Figure 20:
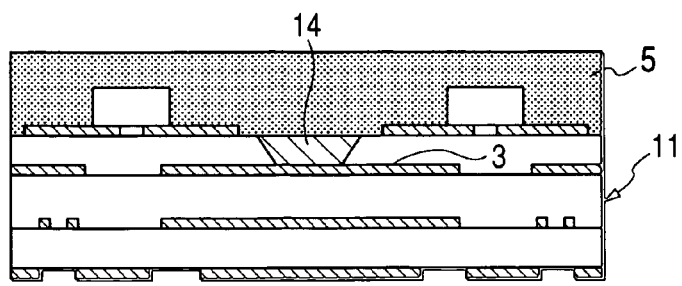
FIG. 20 is a cross-sectional view illustrating a third process of a method of manufacturing an electronic circuit unit according to a third embodiment of the invention.
Figure 21:
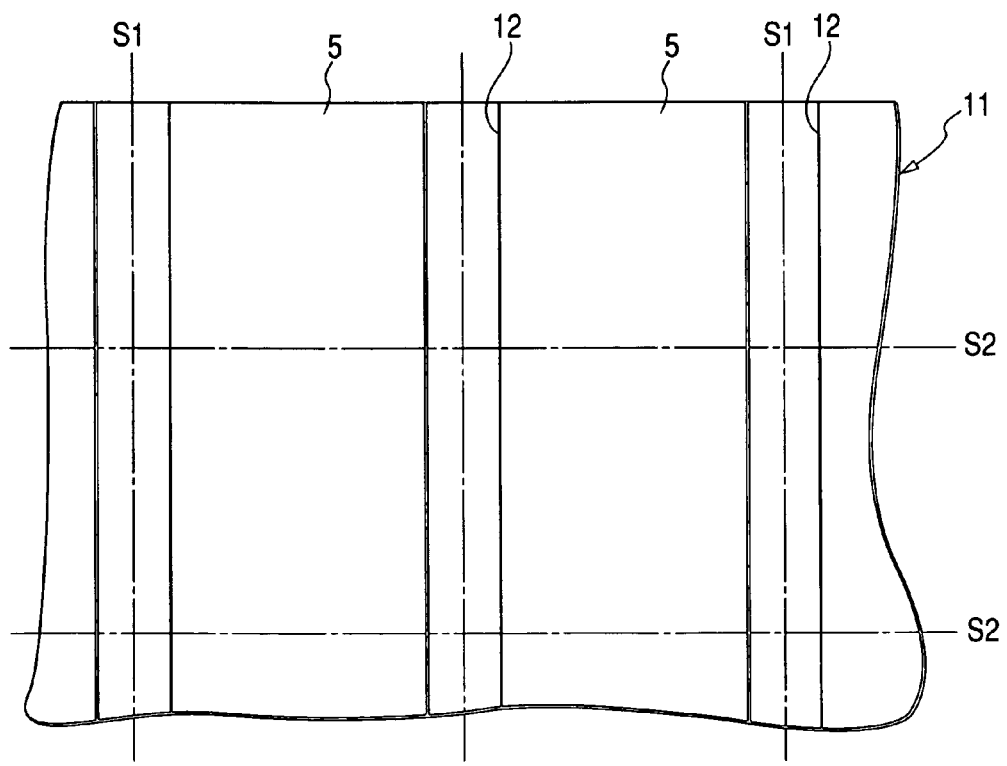
FIG. 21 is a plan view illustrating a fourth process of a method of manufacturing an electronic circuit unit according to a third embodiment of the invention.
Figure 22:
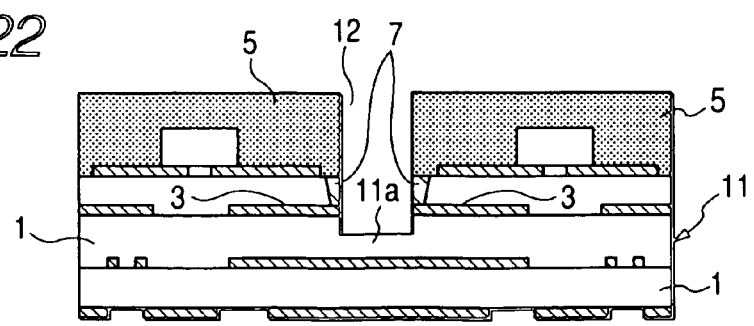
FIG. 22 is a cross-sectional view illustrating a fifth process of a method of manufacturing an electronic circuit unit according to a third embodiment of the invention.
Figure 23:
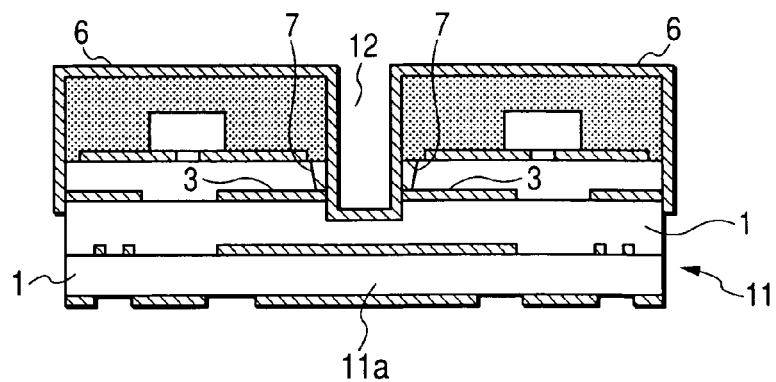
FIG. 23 is a cross-sectional view illustrating a fifth process of a method of manufacturing an electronic circuit unit according to a third embodiment of the invention.
Figure 24:
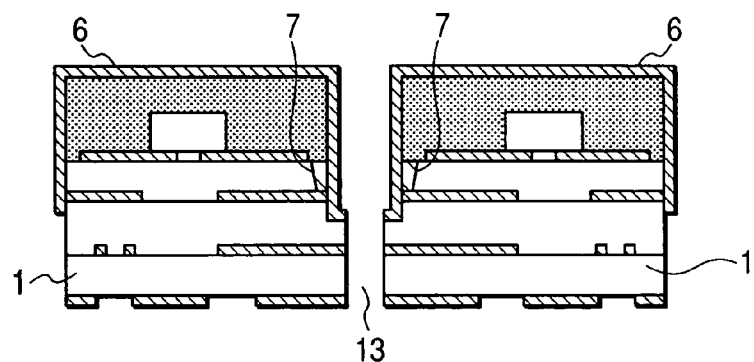
FIG. 24 is a cross-sectional view illustrating a sixth process of a method of manufacturing an electronic circuit unit according to a third embodiment of the invention.

Further, FIG. 10 is a plan view illustrating an electronic circuit unit according to a second embodiment of the invention. FIG. 11 is a cross-sectional view taken along the line XI-XI of FIG. 10. FIG. 12 is a cross-sectional view taken along the line XII-XII of FIG. 10. FIG. 13 is a plan view illustrating a third process of a method of manufacturing the electronic circuit unit according to the second embodiment of the invention;

FIG. 14 is a plan view illustrating an electronic circuit unit according to a third embodiment of the invention. FIG. 15 is a cross-sectional view taken along the line XV-XV of FIG. 14. FIG. 16 is a plan view illustrating a first process of a method of manufacturing an electronic circuit unit according to a third embodiment of the invention. FIG. 17 is a cross-sectional view illustrating a first process of a method of manufacturing an electronic circuit unit according to a third embodiment of the invention. FIG. 18 is a plan view illustrating a second process of a method of manufacturing an electronic circuit unit according to a third embodiment of the invention. FIG. 19 is a cross-sectional view illustrating a second process of a method of manufacturing an electronic circuit unit according to a third embodiment of the invention. FIG. 20 is a cross-sectional view illustrating a third process of a method of manufacturing an electronic circuit unit according to a third embodiment of the invention. FIG. 21 is a plan view illustrating a fourth process of a method of manufacturing an electronic circuit unit according to a third embodiment of the invention. FIG. 22 is a cross-sectional view illustrating a fifth process of a method of manufacturing an electronic circuit unit according to a third embodiment of the invention. FIG. 23 is a cross-sectional view illustrating a fifth process of a method of manufacturing an electronic circuit unit according to a third embodiment of the invention. FIG. 24 is a cross-sectional view illustrating a sixth process of a method of manufacturing an electronic circuit unit according to a third embodiment of the invention.

Figure 25:
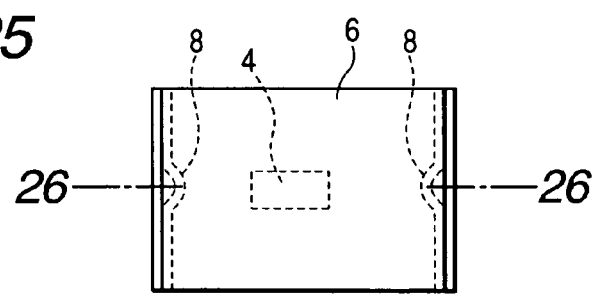
FIG. 25 is a plan view illustrating an electronic circuit unit according to a fourth embodiment of the invention.
Figure 26:
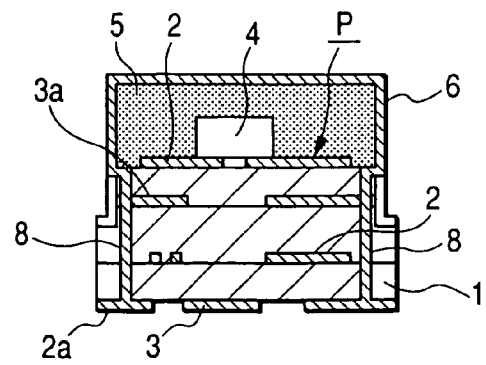
FIG. 26 is a cross-sectional view taken along the line XXVI-XXVI of FIG. 25.
Figure 27:
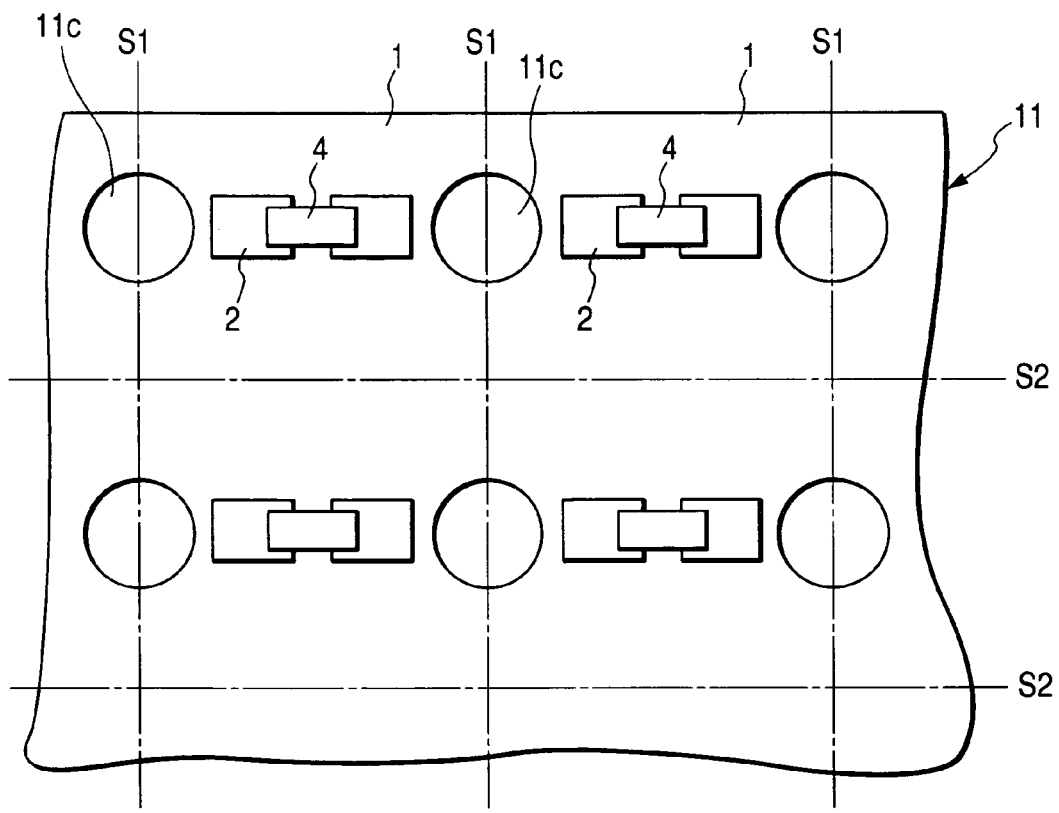
FIG. 27 is a plan view illustrating a first process of a method of manufacturing an electronic circuit unit according to a fourth embodiment of the invention.
Figure 28:
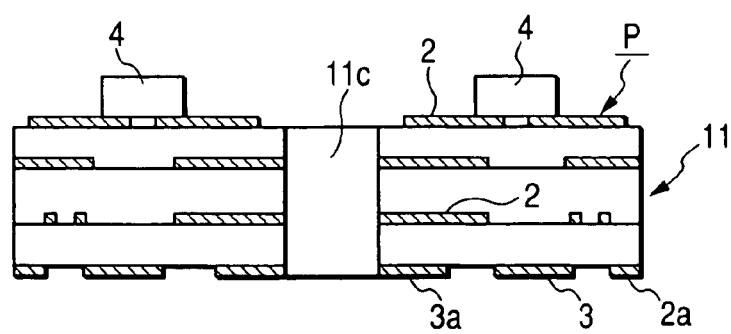
FIG. 28 is a cross-sectional view illustrating a first process of a method of manufacturing an electronic circuit unit according to a fourth embodiment of the invention.
Figure 29:
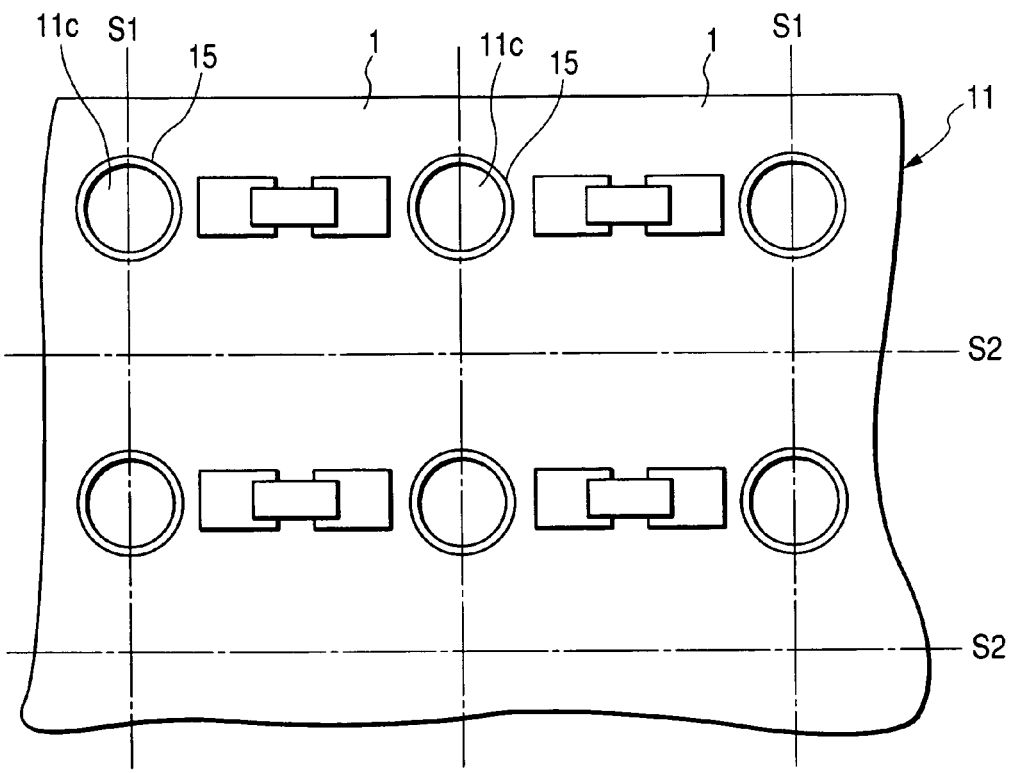
FIG. 29 is a plan view illustrating a second process of a method of manufacturing an electronic circuit unit according to a fourth embodiment of the invention.
Figure 30:
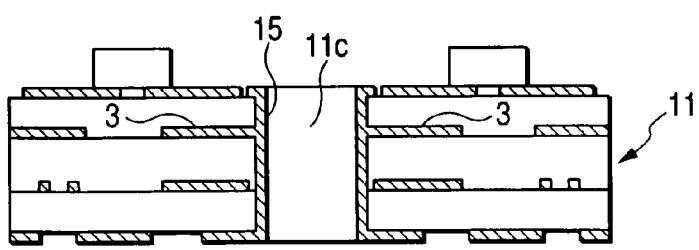
FIG. 30 is a cross-sectional view illustrating a second process of a method of manufacturing an electronic circuit unit according to a fourth embodiment of the invention.
Figure 31:
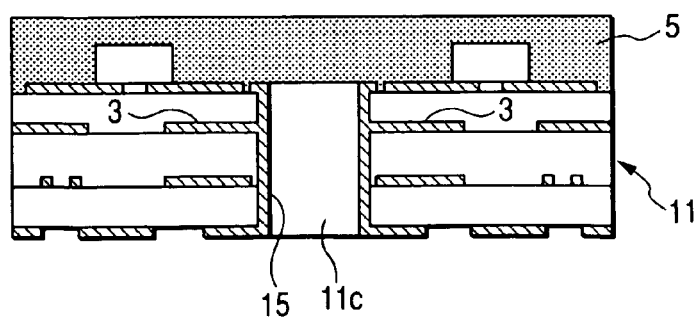
FIG. 31 is a cross-sectional view illustrating a third process of a method of manufacturing an electronic circuit unit according to a fourth embodiment of the invention.
Figure 32:
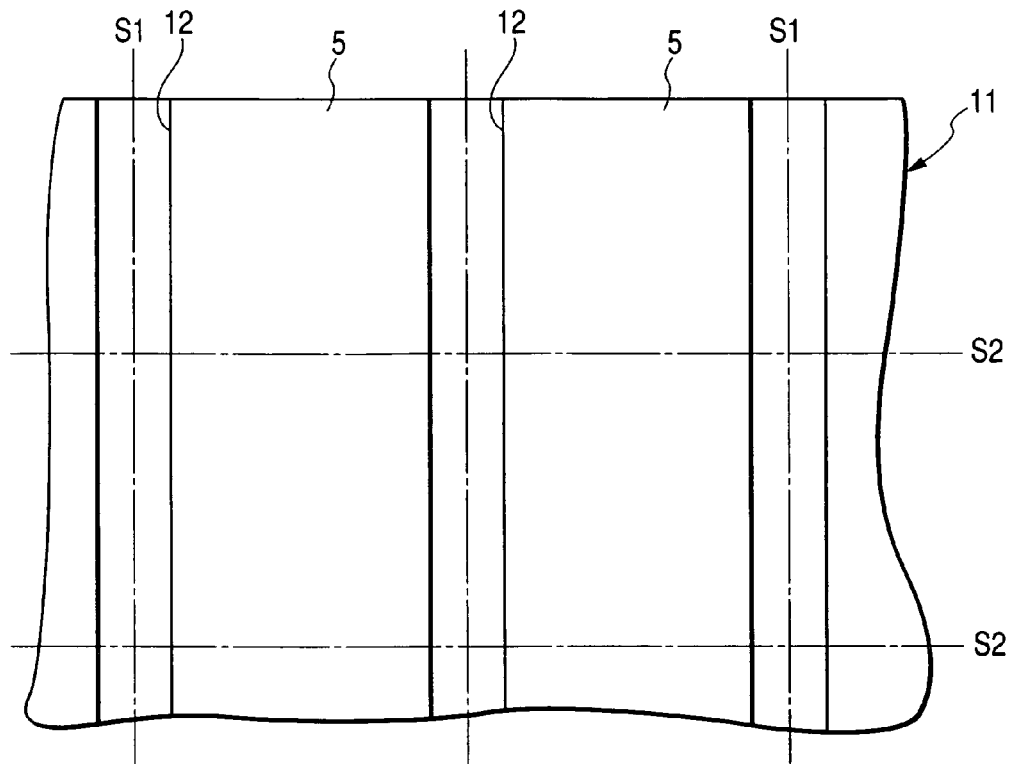
FIG. 32 is a plan view illustrating a fourth process of a method of manufacturing an electronic circuit unit according to a fourth embodiment of the invention.
Figure 33:
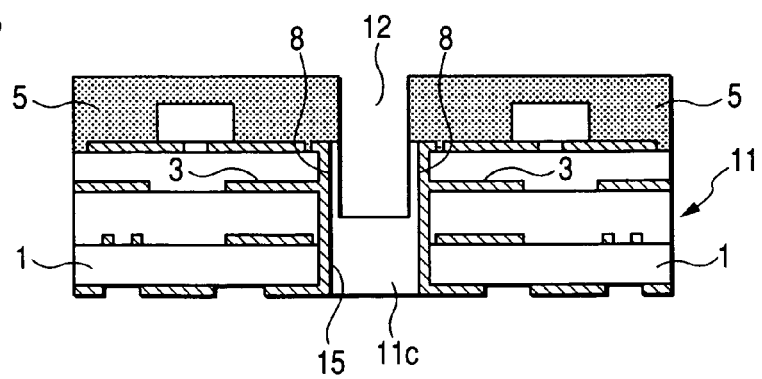
FIG. 33 is a cross-sectional view illustrating a fourth process of a method of manufacturing an electronic circuit unit according to a fourth embodiment of the invention.
Figure 34:
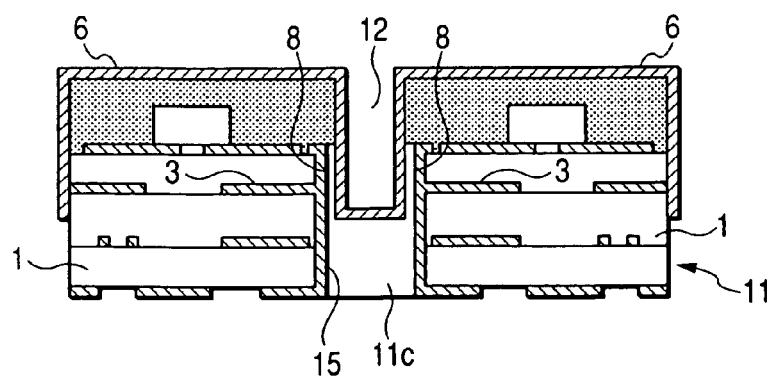
FIG. 34 is a cross-sectional view illustrating a fifth process of a method of manufacturing an electronic circuit unit according to a fourth embodiment of the invention.
Figure 35:
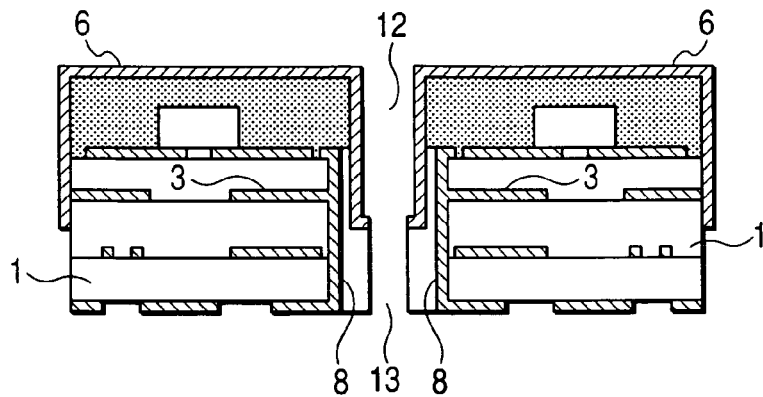
FIG. 35 is a cross-sectional view illustrating a sixth process of a method of manufacturing an electronic circuit unit according to a fourth embodiment of the invention.
Figure 36:
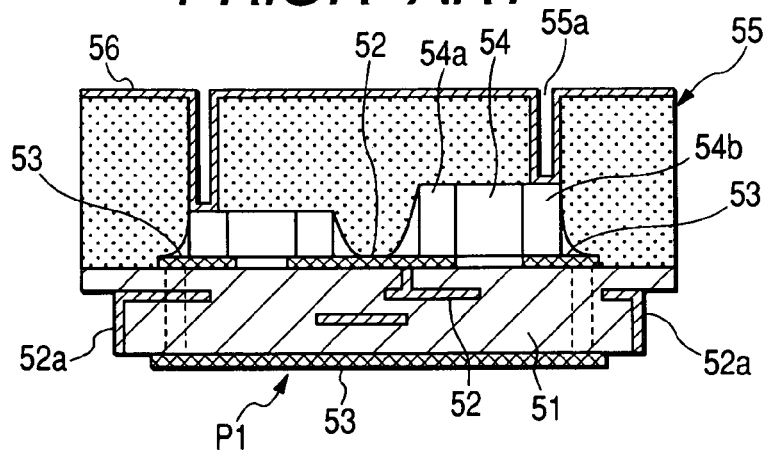
FIG. 36 is a cross-sectional view illustrating a main portion of an electronic circuit unit according to the related art.
Figure 37:
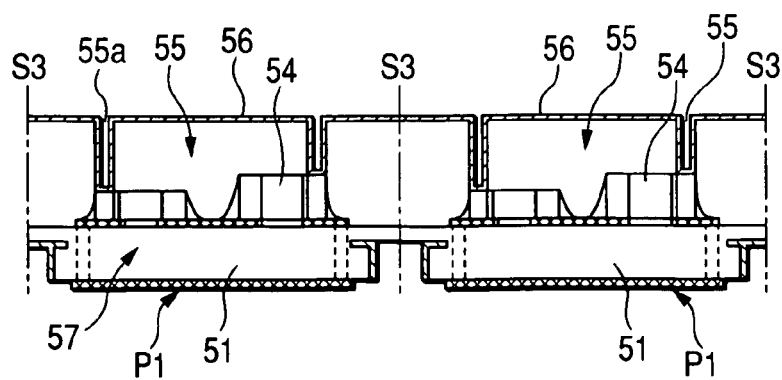
FIG. 37 is a cross-sectional view of a main portion illustrating a method of manufacturing an electronic circuit unit according to the related art.

Furthermore, FIG. 25 is a plan view illustrating an electronic circuit unit according to a fourth embodiment of the invention. FIG. 26 is a cross-sectional view taken along the line XXVI-XXVI of FIG. 25. FIG. 27 is a plan view illustrating a first process of a method of manufacturing an electronic circuit unit according to a fourth embodiment of the invention. FIG. 28 is a cross-sectional view illustrating a first process of a method of manufacturing an electronic circuit unit according to a fourth embodiment of the invention. FIG. 29 is a plan view illustrating a second process of a method of manufacturing an electronic circuit unit according to a fourth embodiment of the invention. FIG. 30 is a cross-sectional view illustrating a second process of a method of manufacturing an electronic circuit unit according to a fourth embodiment of the invention. FIG. 31 is a cross-sectional view illustrating a third process of a method of manufacturing an electronic circuit unit according to a fourth embodiment of the invention. FIG. 32 is a plan view illustrating a fourth process of a method of manufacturing an electronic circuit unit according to a fourth embodiment of the invention. FIG. 33 is a cross-sectional view illustrating a fourth process of a method of manufacturing an electronic circuit unit according to a fourth embodiment of the invention. FIG. 34 is a cross-sectional view illustrating a fifth process of a method of manufacturing an electronic circuit unit according to a fourth embodiment of the invention. FIG. 35 is a cross-sectional view illustrating a sixth process of a method of manufacturing an electronic circuit unit according to a fourth embodiment of the invention.

Next, a structure of an electronic circuit unit according to a first embodiment of the invention will be described with reference to FIGS. 1 and 2. A multi-layered substrate 1 is made of an insulating material, such as a ceramic material or the like. This multi-layered substrate 1 is formed of a rectangular laminated substrate. Here, reference numeral is omitted, but the multi-layered substrate 1 has a top surface, a bottom surface, two pairs of side surfaces that are opposite to each other, and laminated layers (inner laminated layers).

A wiring pattern P has signal patterns 2 and grounding patterns 3. The signal patterns 2 of the wiring pattern P are provided on the top surface and the laminated layers (inner laminated layers) of the multi-layered substrate 1 and have a plurality of terminals 2a that are provided on the bottom surface of the multi-layered substrate 1. Further, the grounding patterns 3 are provided on the laminated layers (inner laminated layers) and the bottom surface of the multi-layered substrate 1 and have terminal portions 3a that are provided on the bottom surface of the multi-layered substrate 1. Furthermore, the grounding patterns 3, which are located between the laminated layers, are exposed to the side surfaces of the multi-layered substrate 1 that are opposite to each other.

In addition, the terminal portion 2a of the signal pattern 2 is connected to the signal pattern 2 that is provided on the top surface or the laminated layers of the multi-layered substrate 1 by means of a connector, such as a through hole or the like, which is not shown in the drawing. In addition, the terminal portion 3a of the grounding pattern 3 is connected to the grounding pattern 3 that is provided on the laminated layers of the multi-layered substrate 1 by means of a connector, such as a through hole, a side electrode or the like, which is not shown in the drawing.

Further, in FIG. 2, the signal pattern 2 and the grounding pattern 3 are provided on the laminated layers, but the signal pattern 2 and the grounding pattern 3 may be provided on any laminated layers. In addition, a both-sided substrate may be formed such that it has the signal pattern 2 and the grounding pattern 3 provided on two layers of a top surface and a bottom surface without the signal pattern 2 and the grounding pattern 3 being provided on the laminated layers.

In a state in which an electronic component 4 made of a chip component or the like is disposed on the top surface of the multi-layered substrate 1, it is soldered to the signal pattern 2 and mounted on the top surface of the multi-layered substrate 1, which results in forming a predetermined electric circuit.

In a state in which a sealing resin portion 5 made of an insulating material covers an entire surface of the electronic component 4 so as to bury the electronic component 4, it is provided on the entire surface of the top surface of the multi-layered substrate 1. This sealing resin portion 5 has a rectangular pillar shape. In addition, although not shown, the sealing resin portion 5 has a structure in which it has a top surface, and two pairs of side surfaces that are opposite to each other. In this case, the side surfaces of the sealing resin portion 5 and the side surfaces of the multi-layered substrate 1 are on the same plane.

A metallic film 6 is formed by a plating method or the like. The metallic film 6 is provided on the entire surface of the top surface of the sealing resin portion 5, the entire surfaces of one pair of side surfaces of the sealing resin portion 5 that are opposite to each other, and the entire surfaces of one pair of side surfaces of the multilayered substrate 1, opposite to each other, that are located between the top surface of the multi-layered substrate 1 and the grounding pattern 3 provided on the laminated layers.

In addition, the metallic film 6 is connected to the grounding pattern 3 at locations of the side surfaces of the multi-layered substrate 1, and electrically shields the electronic component 4 or the signal pattern 2 located on the top surface of the multi-layered substrate 1. As a result, the electronic circuit unit according to the present embodiment is formed.

In the electronic circuit unit according to the present embodiment having the above-mentioned structure, although not shown, the bottom surface of the multi-layered substrate 1 is disposed on a mother substrate, and terminal portions 2a and 3a, which are provided on the bottom surface of the multi-layered substrate 1, are soldered to a conductive pattern provided on the mother substrate. As a result, the electronic circuit unit according to the present embodiment is surface-mounted on the mother substrate.

In addition, in the above-mentioned embodiment, the metallic film 6 is connected to the connection patterns 3 that are provided on the laminated layers. However, the grounding patterns 3 may be provided on the top surface of the multi-layered substrate 1, and they may be connected to the metallic film 6 at the locations of the side surfaces of the multi-layered substrate 1.

In addition, in the present embodiment, the signal patterns 2, which are located on the laminated layers, are located below the grounding patterns 3 that are located on the laminated layers, that is, on the bottom surface side of the grounding patterns 3. However, the signal patterns 2, which are located on the laminated layers, may be located above the grounding patterns 3 that are located on the laminated layers, that is, on the top surface side of the grounding patterns 3, and the signal patterns 2, which are located on the laminated layers, may also be electrically shielded by means of the metallic film 6.

Next, a method of manufacturing the electronic circuit unit according to the first embodiment of the invention will be described with reference to FIGS. 3 to 9. First, as shown in FIGS. 3 and 4, an assembly substrate 11 is prepared so as to form a plurality of multi-layered substrates 1. Then, in a first process illustrated in FIGS. 3 and 4, in the assembly substrate 11, electronic components 4 are mounted (installed) so as to correspond to each of the plurality of multi-layered substrates 1.

Then, in a second process illustrated in FIG. 5, on the entire surface of the top surface of the assembly substrate 11, the sealing resin portion 5 is provided for burying the electronic components 4. Then, in a third process illustrated in FIGS. 6 and 7, at a location between the multi-layered substrates 1 adjacent to each other (a cutting line S1), in the assembly substrate 11 and the sealing resin portion 5, a slit portion 12 is provided from the top surface of the sealing resin portion 5 to the location to which the grounding patterns 3 located on the laminated layers are exposed, in a state in which the plurality of multi-layered substrates 1 are connected to each other by means of a connecting portion 11a located on a lower portion side of the assembly substrate 11. As a result, in the sealing resin portion 5, a pair of side surfaces, which are opposite to each other, are formed by means of the slit portion 12. In addition, in the multi-layered substrate 1, portions of a pair of side surfaces, which are opposite to each other, are formed by means of the slit portion 12.

In this third process, the plurality of sit portions 12 are formed so as to be parallel to each other.

Then, in a fourth process illustrated in FIG. 8, in the sealing resin portion 5 and the assembly substrate 11, the metallic film 6 including the inner portion of the slit portion 12, which are connected to the grounding patterns 3 located on the laminated layers, is formed by a plating method.

The metallic film 6, which is formed in the fourth process, is formed on the entire surface of the inner portion of the slit portion 12 (the side surfaces of the sealing resin portion 5, the portions of the side surfaces of the multi-layered substrate 1, and the bottom surface of the slit portion 12), and the top surface of the sealing resin portion 5.

Then, in the fifth process illustrated in FIG. 9, cutting portions 13 are provided between adjacent multi-layered substrates 1 (see cutting lines S1 and S2 of FIG. 6), such that electronic circuit units are individually separated from each other.

The cutting portion 13, which is formed in the fifth process, has a smaller width than the slit portion 12, and it is cut at the location of the bottom surface of the slit portion 12. At the location of the cutting line S1, a connection portion 11a is cut, and at the location of the cutting line S2, the sealing resin portion 5 and the assembly substrate 11 (connection portion 11a where the slit portion 12 does not exist) are cut. In this way, the electronic circuit unit according to the present embodiment is completely manufactured.

In addition, FIGS. 10 to 12 are diagrams illustrating an electronic circuit unit according to a second embodiment of the invention. Hereinafter, the second embodiment of the invention will be described. A metallic film 6 is provided on the entire surface of the top surface of a sealing resin portion 5, the entire surfaces of two pairs of side surfaces of the sealing resin portion 5 that are opposite to each other, and the entire surfaces of two pairs of side surfaces of the multi-layered substrate 1, opposite to each other, which are located between the top surface of the multi-layered substrate 1 and the grounding patterns 3 provided on the laminated layers.

That is, the metallic film 6 is provided on the entire surface of the external surface of the sealing resin portion 5 that is exposed to the outside, and the entire surfaces of the side surfaces of the multi-layered substrate 1 located between the top surface of the multi-layered substrate 1 and the grounding patterns 3. The metallic film 6 electrically shields the top surface of the multi-layered substrate 1 or the signal patterns 2 provided on the laminated layers.

Since the other structure of the second embodiment is the same as that of the first embodiment, the same components are denoted by the same reference numerals, and the description thereof will be omitted.

In addition, in the second embodiment, the grounding patterns 3 are exposed to each of the two pairs of side surfaces of the multi-layered substrate 1. However, the grounding patterns 3 may be exposed to one side surface of the multi-layered substrate 1 or the pair of side surfaces of the multi-layered substrate 1 that are opposite to each other.

Next, a method of manufacturing the electronic circuit unit according to the second embodiment of the invention will be described with reference to FIG. 13, and FIGS. 3 to 9, which illustrate the method of manufacturing the electronic circuit unit according to the first embodiment of the invention. First, as shown in FIGS. 3 and 4, an assembly substrate 11 is prepared so as to form a plurality of multi-layered substrates 1. Then, in a first process illustrated in FIGS. 3 and 4, in the assembly substrate 11, electronic components 4 are mounted (installed) so as to correspond to each of the plurality of multi-layered substrates 1. Then, in a second process illustrated in FIG. 5, on the entire surface of the top surface of the assembly substrate 11, the sealing resin portion 5 is provided for burying the electronic components 4.

That is, the first and second processes of the second embodiment are the same as those of the first embodiment.

Then, in a third process illustrated in FIG. 13, at the locations between the multi-layered substrates 1 adjacent to each other (cutting lines S1 and S2), in the assembly substrate 11 and the sealing resin portion 5, a slit portion 12 is provided from the top surface of the sealing resin portion 5 to the location to which the grounding patterns 3 located on the laminated layers are exposed, in a state in which the plurality of multi-layered substrates 1 are connected to each other by means of a connecting portion 11a located on a lower portion side of the assembly substrate 11. As a result, in the sealing resin portion 5, the two pair of side surfaces, which are opposite to each other, are formed by the slit portion 12. In addition, in the multi-layered substrate 1, portions of the two pairs of side surfaces, which are opposite to each other, are formed by means of the slit portion 12.

In this third process of the second embodiment, the plurality of sit portions 12 are formed in a lattice.

Then, in a fourth process illustrated in FIG. 8, in the sealing resin portion 5 and the assembly substrate 11, the metallic film 6 including the inner portion of the slit portion 12, which is connected to the grounding patterns 3 located on the laminated layers, is formed by a plating method.

The metallic film 6, which is formed in the fourth process, is formed on the entire surface of the inner portion of the slit portion 12 (the side surfaces of the sealing resin portion 5, the portions of the side surfaces of the multi-layered substrate 1, and the bottom surface of the slit portion 12), and the top surface of the sealing resin portion 5.

That is, the forth process of the second embodiment is the same as that of the first embodiment.

Then, in the fifth process illustrated in FIG. 9, cutting portions 13 are provided between adjacent multi-layered substrates 1 (see cutting lines S1 and S2 of FIG. 13), such that electronic circuit units are individually separated from each other.

The cutting portion 13, which is formed in the fifth process, has a smaller width than the slit portion 12, and it is cut at the location of the bottom surface of the slit portion 12. At the locations of the cutting lines S1 and S2, the connection portion 11a is cut. In this way, the electronic circuit unit according to the present embodiment is completely manufactured.

In addition, FIGS. 14 to 15 are diagrams illustrating an electronic circuit unit according to a third embodiment of the invention. Hereinafter, the third embodiment of the invention will be described. The multi-layered substrate 1 has connection conductors 7. The connection conductors 7 are provided over regions between the top surface of the multi-layered substrate 1 and portions of the side surfaces of the multi-layered substrate 1 where the grounding patterns 3 are located. The connection conductors 7 are connected to the grounding patterns 3 at the locations of the side surfaces of the multi-layered substrate 1. The connection conductor 7 is connected to the metallic film 6.

Since the other structure of the third embodiment is the same as that of the first embodiment, the same components are denoted by the same reference numerals, and the description thereof will be omitted.

In addition, in the third embodiment, the metallic film 6 is provided on the top surface of the sealing resin portion 5, the pair of side surfaces of the sealing resin portion 5, and the pair of side surfaces of the multi-layered substrate 1. However, as in the second embodiment illustrated in FIGS. 10 to 12, the metallic film 6 may be provided on the entire surface of the external surface of the sealing resin portion 5 that is exposed to the outside, and the entire surfaces of the side surfaces of the multi-layered substrate 1 located between the top surface of the multi-layered substrate 1 and the grounding pattern 3.

Next, a method of manufacturing the electronic circuit unit according to the third embodiment of the invention will be described with reference to FIGS. 16 to 24. First, as shown in FIGS. 16 and 17, the assembly substrate 11 has cutting grooves 11b that are provided between adjacent multi-layered substrates 1 (a cutting line S1) so as to expose the grounding patterns 3 located on the laminated layers. This assembly substrate 11 is prepared so as to form the plurality of multi-layered substrates 1. Then, in a first process illustrated in FIGS. 16 and 17, in the assembly substrate 11, electronic components 4 are mounted (installed) so as to correspond to the plurality of multi-layered substrates 1.

Then, in a second process illustrated in FIGS. 18 and 19, conductor portions 14 made of conductive materials are filled into the cutting grooves 11b, and the conductor portions 14 are connected to the grounding patterns 3.

The conductor portions 14 are provided so as to be parallel to each other, and form the connection conductors 7 described later.

Then, in a third process illustrated in FIG. 20, the sealing resin portion 5 is provided on the entire surface of the top surface of the assembly substrate 11 and the top surface of the conductor portion 14 so as to bury the electronic components 4.

Then, in the fourth process illustrated in FIGS. 21 and 22, at the locations between the multi-layered substrates 1 adjacent to each other (cutting line S1), in the assembly substrate 11, the sealing resin portion 5, and the connector portion 14, a slit portion 12 is provided from the top surface of the sealing resin portion 5 to the locations to which the grounding patterns 3 located on the laminated layers are exposed, in a state in which the plurality of multi-layered substrates 1 are connected to each other by means of a connecting portion 11a located on the lower portion side of the assembly substrate 11.

In the fourth embodiment, the connector portion 14 is divided by the slit portion 12. As a result, in the slit portion 12, the connection conductor 7 that is connected to the grounding pattern 3 is formed. In addition, in the sealing resin portion 5, the pair of side surfaces, which are opposite to each other, are formed by the slit portion 12, and in the multi-layered substrate 1, portions of the pair of side surfaces, which are opposite to each other, are formed by the slit portion 12.

Then, in a fifth process illustrated in FIG. 23, in the sealing resin portion 5 and the assembly substrate 11 including the inner portion of the slit portion 12, the metallic film 6, which is connected to the grounding patterns 3 located on the laminated layers, is formed by a plating method.

The metallic film 6, which is formed in the fifth process, is attached to the top surface of the connection conductor 7, and it is formed on the entire surface of the inner portion of the slit portion 12 (the side surfaces of the sealing resin portion 5, the portions of the side surfaces of the multi-layered substrate 1, and the bottom surface of the slit portion 12), and the top surface of the sealing resin portion 5.

Then, in the sixth process illustrated in FIG. 24, cutting portions 13 are provided between adjacent multi-layered substrates 1 (see cutting lines S1 and S2 of FIG. 21), such that electronic circuit units are individually separated from each other.

The cutting portion 13, which is formed in the sixth process, has a smaller width than the slit portion 12, and it is cut at the location of the bottom surface of the slit portion 12. At the location of the cutting line S1, a connection portion 11a is cut, and at the location of the cutting line S2, the sealing resin portion 5 and the assembly substrate 11 (the connection portion 11a where the slit portion 12 does not exist) are cut. In this way, the electronic circuit unit according to the present embodiment is completely manufactured.

In addition, in the third embodiment, similar to the second embodiment illustrated in FIG. 13, the slit portions 12 may be formed in a lattice.

In addition, FIGS. 25 to 26 are diagrams illustrating an electronic circuit unit according to a fourth embodiment of the invention. Hereinafter, the fourth embodiment of the invention will be described. The multi-layered substrate 1 has side electrodes 8. The side electrodes 8 are provided over regions ranging from the top surface of the multi-layered substrate 1 to concave side surfaces reaching the bottom surface of the multi-layered substrate 1. The side electrodes 8 are connected to the grounding patterns 3 at the locations of the concave side surfaces. The side electrode 8 is connected to the metallic film 6.

Since the other structure of the fourth embodiment is the same as that of the first embodiment, the same components are denoted by the same reference numerals, and the description thereof will be omitted.

In addition, in the fourth embodiment, the metallic film 6 is provided on the top surface of the sealing resin portion 5, the pair of side surfaces of the sealing resin portion 5, and the pair of side surfaces of the multi-layered substrate 1. However, as in the second embodiment illustrated in FIGS. 10 to 12, the metallic film 6 may be provided on the entire surface of the external surface of the sealing resin portion 5 that is exposed to the outside, and the entire surfaces of the side surfaces of the multi-layered substrate 1 located between the top surface of the multi-layered substrate 1 and the grounding patterns 3.

Next, a method of manufacturing the electronic circuit unit according to the fourth embodiment of the invention will be described with reference to FIGS. 27 to 35. First, as shown in FIGS. 27 and 28, the assembly substrate 11 has through holes 11c that are provided between adjacent multi-layered substrates 1 (a cutting line S1) so as to expose the grounding patterns 3 located on the laminated layers. This assembly substrate 11 is prepared so as to form the plurality of multi-layered substrates 1. Then, in a first process illustrated in FIGS. 27 and 28, in the assembly substrate 11, electronic components 4 are mounted (installed) so as to correspond to the plurality of multi-layered substrates 1.

Then, in a second process illustrated in FIGS. 29 and 30, a conductor 15 is provided on a wall surface of the through hole 11c, and the conductor 15 is connected to the grounding patterns 3.

The conductor 15 is provided on the wall surface of the through hole 11c that is provided between the multi-layered substrates 1 adjacent to each other, and forms the side electrode 8, which will be described in detail below.

Then, in a third process illustrated in FIG. 31, the sealing resin portion 5 is provided on the entire surface of the top surface of the assembly substrate 11 and the top surface of the through hole 11c so as to bury the electronic components 4.

In the third process, a jig (not shown) is inserted into the through hole 11c. As a result, the sealing resin portion 5 is formed in a state in which the through hole 11c is closed.

Then, in the fourth process illustrated in FIGS. 32 and 33, at the locations between the multi-layered substrates 1 adjacent to each other (cutting line S1), in the assembly substrate 11, the sealing resin portion 5, and the connector 15, a slit portion 12 is provided from the top surface of the sealing resin portion 5 to the locations (the location from the top surface to the grounding patterns 3 located on the laminated layers) to which the grounding patterns 3 located on the laminated layers are exposed, in a state in which the plurality of multi-layered substrates 1 are connected to each other by means of a connecting portion 11a located on the lower portion side of the assembly substrate 11.

In the fourth embodiment, the slit portion 12 has a smaller width than the through hole 11c, and a portion of an upper portion of the conductor 15 is divided by the slit portion 12. In the slit portion 12, the side electrode 8 that is connected to the grounding pattern 3 is formed. In the sealing resin portion 5, the pair of side surfaces, which are opposite to each other, are formed by the slit portion 12. In addition, in the multi-layered substrate 1, portions of the pair of side surfaces, which are opposite to each other, are formed by the slit portion 12.

Then, in a fifth process illustrated in FIG. 34, in the sealing resin portion 5 and the assembly substrate 11 including the inner portion of the slit portion 12 and the inner portion of the through hole 11c, the metallic film 6, which is connected to the grounding patterns 3 located on the laminated layers, is formed by a plating method.

The metallic film 6, which is formed in the fifth process, is attached to the surface of the side electrode 8, and it is formed on the entire surface of the inner portion of the slit portion 12 (the side surfaces of the sealing resin portion 5, the portions of the side surfaces of the multi-layered substrate 1, and the bottom surface of the slit portion 12), and the top surface of the sealing resin portion 5.

Then, in the sixth process illustrated in FIG. 35, cutting portions 13 are provided between adjacent multi-layered substrates 1 (see cutting lines S1 and S2 of FIG. 32), such that electronic circuit units are individually separated from each other.

The cutting portion 13, which is formed in the sixth process, has a smaller width than the slit portion 12, and it is cut at the location of the bottom surface of the slit portion 12. At the location of the cutting line S1, a connection portion 11a is cut, and at the location of the cutting line S2, the sealing resin portion 5 and the assembly substrate 11 (the connection portion 11a where the slit portion 12 does not exist) are cut. In this way, the electronic circuit unit according to the present embodiment is completely manufactured.

In addition, in the fourth embodiment, similar to the second embodiment illustrated in FIG. 13, the slit portions 12 may be formed in a lattice.

In the electronic circuit unit according to the aspect of the invention, a metallic film is provided on the top surface of the sealing resin portion for burying the electronic component, the side surfaces of the sealing resin portion that are opposite to each other, and the side surfaces of the multi-layered substrate that are opposite to each other. The metallic film is connected to the grounding patterns that are provided on the top surface of the multi-layered substrate or between the laminated layers of the multi-layered substrate. Therefore, it is possible to achieve a superior electrical shielding effect through the metallic film, as compared with the related art.

Since the metallic film is formed on the side surfaces of the sealing resin and the side surfaces of the multi-layered substrate, when the metallic film is formed by a plating method, the blind hole may not be provided in the related art. Therefore, it is possible to achieve the superior circulation of the plating liquid and the sure connection between the grounding pattern and the metallic film.

Further, the metallic film is provided on an entire surface of the top surface of the sealing resin portion and entire surfaces of the side surfaces of the sealing resin portion that are opposite to each other, the metallic film is connected to the grounding patterns that are provided between the laminated layers of the multi-layered substrate; and the metallic film is provided on the entire surfaces of the side surfaces that are located between the top surface of the multi-layered substrate and the grounding patterns and are opposite to each other. Therefore, an electric shield effect through the metallic film can be further improved.

Further, the wiring pattern has the grounding pattern and signal patterns, and the signal patterns are provided between the laminated layers of the multi-layered substrate that are located above the grounding patterns. Therefore, the signal patterns, which are provided between the laminated layers of the multi-layered substrate that are located above the grounding patterns, can be electrically shielded by the metallic film. As a result, it is possible to obtain an excellent shield effect.

Further, the multi-layered substrate has connection conductors. The connection conductors are provided over regions between the top surface of the multi-layered substrate and portions of the side surfaces of the multi-layered substrate where the grounding patterns are located. The connection conductors are connected to the grounding patterns at the locations of the side surfaces of the multi-layered substrate, and are connected to the metallic film. Therefore, it is possible to surely hold the metallic film on the side surfaces of the multi-layered substrate by the connection conductor. As a result, it is possible to reduce the metallic film from being removed.

Further, the multi-layered substrate has side electrodes. The side electrodes are provided in concave side surfaces reaching from the top surface of the multi-layered substrate to the bottom surface of the multi-layered substrate. The side electrodes are connected to the grounding patterns at the locations of the concave side surfaces. In addition, the side electrodes are connected to the metallic film. Therefore, it is possible to surely hold the metallic film in the side surfaces of the multi-layered substrate by means of the side electrode. As a result, it is possible to reduce the metallic film from being removed.

In addition, on a bottom surface of the multi-layered substrate, terminal portions that are connected to the electronic component are provided. Therefore, the electronic circuit unit can be surface-mounted. In addition, since the grounding pattern is provided on the bottom surface of the multi-layered substrate, a superior electrical shield effect can be obtained.

Further, in the method of manufacturing the above-mentioned shielded electronic circuit unit, the method includes: forming the electronic components and the sealing resin portion in the assembly substrate, the electronic components being mounted so as to correspond to the individual multi-layered substrates, the sealing resin portion burying the electronic components; forming slit portions in the assembly substrate and the sealing resin portion at locations between the multi-layered substrates that are adjacent to each other, the slit portions being provided so as to extend from the top surface of the sealing resin portion to a location to which the grounding patterns located between the laminated layers are exposed, in a state in which the plurality of multi-layered substrates are connected to each other by means of a connecting portion located on a lower portion side of the assembly substrate; forming the side surfaces opposite to each other in the sealing resin portion by means of the slit; forming portions of the side surfaces opposite to each other in the multi-layered substrate by means of the slit portion; forming the metallic film in the sealing resin portion and the assembly substrate including the inner portion of the slit portion, the metallic film being connected to the grounding patterns located between the laminated layers; forming cutting portions in the assembly substrate or the assembly substrate and the sealing resin portion at locations between the adjacent multi-layer substrates; and individually separating the electronic circuit units from each other.

That is, the metallic film is provided on an entire surface of the top surface of the sealing resin portion and entire surfaces of the side surfaces of the sealing resin portion that are opposite to each other, the metallic film is connected to the grounding patterns that are provided between the laminated layers of the multi-layered substrate, and the metallic film is provided on the entire surfaces of the side surfaces that are located between the top surface of the multi-layered substrate and the grounding patterns and are opposite to each other. Therefore, an electric shield effect through the metallic film can be further improved. Since the slit portions are provided in the sealing resin portion and the assembly substrate, in particular, when the metallic film is formed by the plating method, it is possible to achieve the superior circulation of the plating liquid, which results in sure connection between the metallic film and the grounding pattern.

Further, in the method of manufacturing the above-mentioned shielded electronic circuit unit, the method includes: forming the electronic components, cutting grooves, conductor portions, and the sealing resin portion in the assembly substrate, the electronic components being mounted so as to correspond to the individual multi-layered substrates, the cutting grooves exposing the grounding patterns that are provided between the adjacent multi-layered substrates and located between the laminated layers, the conductor portions forming connection conductors that are connected to the grounding patterns and filled into the cutting grooves, the sealing resin portion burying the electronic components and the top surfaces of the conductor portions; forming slit portions in the assembly substrate and the sealing resin portion at locations between the multi-layered substrates that are adjacent to each other, the slit portions being provided to extend from the top surface of the sealing resin portion to locations to which the grounding patterns located between the laminated layers are exposed, in a state in which the plurality of multi-layered substrates are connected to each other by means of a connecting portion located on a lower portion side of the assembly substrate; forming the side surfaces opposite to each other in the sealing resin portion by means of the slit portion; forming portions of the side surfaces opposite to each other in the multi-layered substrate by means of the slit portion; dividing the conductor portions by the slit portions; forming the connection conductors connected to the grounding patterns in the slit portions; forming the metallic film in the sealing resin portion and the assembly substrate including the inner portion of the slit portion, the metallic film being connected to the connection conductors and the grounding patterns located between the laminated layers; forming cutting portions in the assembly substrate or the assembly substrate and the sealing resin portion at locations between the adjacent multi-layer substrates; and individually separating the electronic circuit units from each other.

That is, the metallic film is provided on an entire surface of the top surface of the sealing resin portion and entire surfaces of the side surfaces of the sealing resin portion that are opposite to each other, the metallic film is connected to the grounding patterns that are provided between the laminated layers of the multi-layered substrate, and the metallic film is provided on the entire surfaces of the side surfaces that are located between the top surface of the multi-layered substrate and the grounding patterns and are opposite to each other. Therefore, a superior electric shield effect through the metallic film can be achieved. Since the slit portions are provided in the sealing resin portion and the assembly substrate, in particular, when the metallic film is formed by the plating method, it is possible to achieve the superior circulation of the plating liquid, which results in sure connection between the metallic film and the grounding pattern. In addition, since the metallic film is connected to the connection conductor, it is possible to surely hold the metallic film in the side surfaces of the multi-layered substrate. As a result, it is possible to reduce the metallic film from being removed.

Further, in the method of manufacturing the above-mentioned shielded electronic circuit unit, the method includes: forming the electronic components, through holes, conductors, and the sealing resin portion in the assembly substrate, the electronic components being mounted so as to correspond to the individual multi-layered substrates, the through holes exposing the grounding patterns that are provided between the adjacent multi-layered substrates and located between the laminated layers so as to form the concave side surfaces, the conductors forming connection conductors that are connected to the grounding patterns and form the side electrodes that are formed on the wall surfaces of the through holes, the sealing resin portion burying the electronic components and the top surfaces of the through holes; forming slit portions in the assembly substrate and the sealing resin portion at locations between the multi-layered substrates that are adjacent to each other, the slit portions being provided to extend from the top surface of the sealing resin portion to locations to which the grounding patterns located between the laminated layers are exposed, in a state in which the plurality of multi-layered substrates are connected to each other by means of a connecting portion located on a lower portion side of the assembly substrate; forming the side surfaces opposite to each other in the sealing resin portion by means of the slit portion; forming portions of the side surfaces opposite to each other in the multi-layered substrate by means of the slit portion; dividing portions of the through holes and the conductors by the slit portions; forming portions of the side electrodes that are connected to the grounding patterns in the concave side surfaces located in the divided through holes; forming the metallic film that is connected to the portions of the side electrodes and the grounding patterns located between the laminated layers in the sealing resin portion and the assembly substrate including the concave side surfaces and the inner surfaces of the slit portions; forming cutting portions in the assembly substrate or the assembly substrate and the sealing resin portion at locations between the adjacent multi-layer substrates; and individually separating the electronic circuit units from each other.

That is, the metallic film is provided on an entire surface of the top surface of the sealing resin portion and entire surfaces of the side surfaces of the sealing resin portion that are opposite to each other, the metallic film is connected to the grounding patterns that are provided between the laminated layers of the multi-layered substrate, and the metallic film is provided on the entire surfaces of the side surfaces that are located between the top surface of the multi-layered substrate and the grounding patterns and are opposite to each other. Therefore, a superior electric shield effect through the metallic film can be achieved. Since the slit portions are provided in the sealing resin portion and the assembly substrate, in particular, when the metallic film is formed by the plating method, it is possible to achieve the superior circulation of the plating liquid, which results in sure connection between the metallic film and the grounding pattern. In addition, since the metallic film is connected to the side electrode, it is possible to surely hold the metallic film in the side surfaces of the multi-layered substrate. As a result, it is possible to reduce the metallic film from being removed.

Further, since the cutting portion has a smaller width than the slit portion, when the assembly substrate is cut, the metallic film provided on the side wall surface of the slit portion can be prevented from being removed.

Further, the slit portions are formed in a lattice in a state in which the slit portions are located between the adjacent multi-layered substrates, and the cutting portion is provided on the connection portion provided so as to correspond to the location of the slit portion, such that electronic circuit units are individually separated from each other. Therefore, when the electronic circuit units are individually separated from each other, a cutting process of the assembly substrate may be performed on only the connection portion. Accordingly, it is possible to achieve superior productivity.

Further, since the metallic film is formed by a plating method, the metallic film can be easily formed. Therefore, it is possible to achieve superior productivity.

The invention claimed is:

1. A method of manufacturing shielded electronic circuit units, the method comprising:
   forming electronic components and a sealing resin portion in an assembly substrate, the electronic components being mounted so as to correspond to individual multi-layered substrates, the sealing resin portion burying the electronic components;
   forming slit portions in the assembly substrate and the sealing resin portion at locations between the multi-layered substrates that are adjacent to each other, the slit portions being provided so as to extend from the top surface of the sealing resin portion to a location to which grounding patterns located between laminated layers are exposed, in a state in which the multi-layered substrates are connected to each other by a connecting portion located on a lower portion of the assembly substrate, wherein said forming the slit portions includes:
      forming first portions of side surfaces facing each other in the sealing resin portion across the slit portions; and;
      forming second portions of the side surfaces facing each other in the multi-layered substrate across the slit portions;
   forming a metallic film in the sealing resin portion and the assembly substrate including an inner portion of the slit portions, the metallic film being connected to the grounding patterns located between the laminated layers;
   forming cutting portions in the assembly substrate at locations between the adjacent multi-layer substrates and corresponding to the locations of the slit portions; and
   individually separating the shielded electronic circuit units from each other through the slit portions and the cutting portions, wherein the cutting portions have a smaller width than the slit portions.

2. The method of manufacturing the shielded electronic circuit units according to claim 1, further comprising:

forming cutting grooves between the adjacent multi-layered substrate, the cutting grooves exposing the grounding patterns that are provided between the adjacent multi-layered substrates and located between the laminated layers; and forming conductor portions that fill the cutting grooves and are connected to the grounding patterns and wherein the sealing resin portion further covers top surfaces of the conductor portions, wherein said forming the slit portions further includes:
dividing the conductor portions by the slit portions, the divided conductor portions;
forming connection conductors along the second portions of the side surfaces, the connection conductors connected to the grounding patterns in the slit portions;

and wherein in said forming the metallic film, the metallic film is further connected to the connection conductors.

3. The method of manufacturing the shielded electronic circuit units according to claim 1, further comprising:
forming through holes exposing the grounding patterns that are provided between the adjacent multi-layered substrates and located between the laminated layers; and
forming connection conductors on wall surfaces of the through holes, the connection conductors being connected to the grounding patterns, the sealing resin portion being formed over the top of the through holes, wherein said forming slit portions further includes:
dividing portions of the through holes and the connection conductors formed therein by the slit portions, the divided portions of the connection conductors
forming side electrodes that are connected to the grounding patterns located in the concave side surfaces of the divided through holes;

and wherein in said forming the metallic film, the metallic film is further formed on the concave side surfaces in the divided through holes and connected to the side electrodes.

4. The method of manufacturing the shielded electronic circuit units according to claim 1,
wherein the slit portions are formed in a lattice in a state in which the slit portions are located between the adjacent multi-layered substrates, and
the cutting portions are provided on the connecting portions, such that shielded electronic circuit units are individually separated from each other.

5. The method of manufacturing the shielded electronic circuit units according to claim 1,
wherein the metallic film is formed by a plating method.

* * * * *